(12) United States Patent
Thumm et al.

(10) Patent No.: US 12,130,307 B2
(45) Date of Patent: *Oct. 29, 2024

(54) METHOD FOR PRODUCING A DEVICE FOR MEASURING CURRENT STRENGTHS, AND DEVICE FOR MEASURING CURRENT STRENGTHS

(71) Applicant: WIELAND-WERKE AG, Ulm (DE)

(72) Inventors: Gerhard Thumm, Erbach (DE); Dragoslav Vucic-Seele, Ulm (DE); Tony Robert Noll, Dietenheim (DE)

(73) Assignee: WIELAND-WERKE AG, Ulm (DE)

( * ) Notice: Subject to any disclaimer, the term of this patent is extended or adjusted under 35 U.S.C. 154(b) by 296 days.

This patent is subject to a terminal disclaimer.

(21) Appl. No.: 17/852,572

(22) Filed: Jun. 29, 2022

(65) Prior Publication Data

US 2023/0003766 A1   Jan. 5, 2023

(30) Foreign Application Priority Data

Jun. 30, 2021 (DE) .......................... 102021003365.5
Nov. 24, 2021 (DE) .......................... 102021005839.9

(51) Int. Cl.
*G01R 1/20* (2006.01)
*G01R 19/00* (2006.01)
(Continued)

(52) U.S. Cl.
CPC .......... *G01R 1/203* (2013.01); *G01R 19/0092* (2013.01); *H01C 1/14* (2013.01); *H01C 17/28* (2013.01)

(58) Field of Classification Search
CPC .......... H01C 1/14; H01C 17/28; G01R 1/203; G01R 19/0092
See application file for complete search history.

(56) References Cited

U.S. PATENT DOCUMENTS 8,319,499 B2   11/2012   Gronwald et al.
8,598,976 B2   12/2013   Hetzler
(Continued)

FOREIGN PATENT DOCUMENTS

DE          658916       4/1938
DE    102007033182 B4    1/2009
(Continued)

OTHER PUBLICATIONS

European Search Report issued in corresponding European Application No. 22000149.9, with English translation of categories of cited documents, dated Dec. 1, 2022 (11 pages).

*Primary Examiner* — Kyung S Lee
(74) *Attorney, Agent, or Firm* — FLYNN THIEL, P.C.

(57) ABSTRACT

A method for producing a device for measuring current strengths. The method includes providing a resistor arrangement with two connection elements and a resistor element arranged between the connection elements, molding a contact element from the material of the connection element or from the material of the resistor element. The contact element has an end face remote from the resistor arrangement and a cavity open on the end face. The method further includes providing a circuit board with a through-bore on whose inner surface electrically conductive material is present, positioning the circuit board on the resistor arrangement such that the contact element projects into the through-bore, and expanding the contact element in the radial direction using an expansion element inserted into the cavity of the contact element to establish an electrically conductive connection between the contact element and the electrically conductive material on the inner surface of the through-bore.

15 Claims, 5 Drawing Sheets

(51) Int. Cl.
*H01C 1/14* (2006.01)
*H01C 17/28* (2006.01)

(56) References Cited

U.S. PATENT DOCUMENTS

| | | | |
|---|---|---|---|
| 10,163,553 B2 | 12/2018 | Kameko et al. | |
| 11,821,922 B2* | 11/2023 | Thumm | H05K 3/308 |
| 2015/0108965 A1 | 4/2015 | Sato | |
| 2021/0382092 A1 | 12/2021 | Thumm et al. | |

FOREIGN PATENT DOCUMENTS

| | | |
|---|---|---|
| DE | 102009031408 A1 | 1/2011 |
| DE | 102020003458 A1 | 12/2021 |
| EP | 0605800 A1 | 7/1994 |
| EP | 3929594 A1 | 12/2021 |
| FR | 2544866 A1 | 10/1984 |

* cited by examiner

METHOD FOR PRODUCING A DEVICE FOR MEASURING CURRENT STRENGTHS, AND DEVICE FOR MEASURING CURRENT STRENGTHS

CROSS-REFERENCE TO RELATED APPLICATIONS

This claims priority from German Application No. 10 2021 003 365.5, filed Jun. 30, 2021, and German Application No. 10 2021 005 839.9, filed Nov. 24, 2021, the disclosures of which are hereby incorporated by reference in their entireties.

TECHNICAL FIELD

The invention relates to a method for producing a device for measuring current strengths and to such a device.

BACKGROUND AND SUMMARY

To measure current in electronic circuits, use is made of measuring resistors that are connected in series with the component to be monitored. The current strength is in this case determined from the voltage dropped across the measuring resistor, referred to as shunt resistor. Correctly and reliably measuring the current strength is for example particularly important in a battery management system of an electric or hybrid vehicle. A resistor arrangement that comprises such a low-value measuring resistor of approximately 10 to 50 μohm and connection elements for connecting the resistor arrangement to the circuit is able to be produced from a longitudinally seam-welded composite material. This is known for example from document EP 0 605 800 A1. The composite material is produced from three metal strips by connecting the individual metal strips to one another, in each case via a longitudinal seam, using an electron-beam or laser welding process.

The voltage dropped across a measuring resistor is tapped off via contact pins or similar elements that are arranged on the connection elements on both sides of the measuring resistor. Such contact pins may be soldered, pressed or welded onto the connection elements of the resistor arrangement. The voltage is acquired and processed further by measuring and evaluation electronics. Electronic components are provided for this purpose and may be arranged on a circuit board. The circuit board may in this case be located in the immediate vicinity of the resistor arrangement.

Document DE 10 2009 031 408 A1 discloses a resistor arrangement having a low-value current measuring resistor. In this resistor arrangement, in order to tap off the voltage, provision is made for connection contacts that are formed by embossing and forming threads in the plate-shaped subcomponents that serve to connect the resistor arrangement to the external circuit. The connection of the measuring lines to the connection contacts for the voltage measurement is implemented by way of cable lugs and fastening screws.

U.S. Pat. No. 10,163,553 B2 furthermore discloses a resistor arrangement having two plate-shaped elements for connecting the resistor arrangement to an external circuit and a strip-shaped resistor element. A respective hole is present on both sides of the resistor element in both connection elements, a respective contact pin being plugged into said holes. The contact pins are separate components that have to be produced separately and added to the resistor arrangement.

In the devices known from the prior art, it is necessary to use additional components in order to tap off the voltage dropped across the measuring resistor. This requires additional outlay and costs. Contact voltages may furthermore occur at the contact points of the individual components and may distort the voltage signal.

The invention is based on the object of specifying an improved, in particular simpler and less expensive method for producing a device for measuring current strengths, and such a device.

The invention relates to a method for producing a device for measuring current strengths using a resistor arrangement, wherein the method includes the following steps:

a) providing a resistor arrangement including at least two connection elements, which define a current direction, and at least one resistor element arranged between the connection elements in relation to the current direction, wherein the at least one resistor element, on the one hand, and the connection elements, on the other hand, consist of different electrically conductive materials, b) molding at least one contact element from the material of at least one connection element or from the material of the resistor element, wherein the contact element has a longitudinal axis that defines an axial direction and a radial direction perpendicular thereto, and wherein the contact element is molded such that it has an end face remote from the resistor arrangement and a cavity that is open on the end face, remote from the resistor arrangement, of the contact element, c) providing a circuit board that has at least one through-bore having an inner surface on which electrically conductive material is present, d) positioning the circuit board on the resistor arrangement such that the circuit board has an upper side remote from the resistor arrangement and that the at least one contact element at least projects into the through-bore, e) expanding the contact element in the radial direction using an expansion element, which is inserted into the cavity of the contact element in the axial direction, so as to establish an electrically conductive connection between the contact element and the electrically conductive material on the inner surface of the through-bore.

Measuring current strengths is also understood to mean measuring the strength of an electric current that possibly changes over time. The resistor arrangement described above may comprise a shunt resistor having a resistance of 10 to 15 μohm as resistor element. Both the resistor element and the connection elements consist of electrically conductive materials. The specific electrical resistance of the material of the resistor element is in this case significantly greater, typically at least a factor of 10 greater, than the specific electrical resistance of the material of the connection elements. On the other hand, the absolute value of the temperature coefficient of resistance of the material of the connection elements is very much greater, typically at least a factor of 80 greater, than the absolute value of the temperature coefficient of resistance of the material of the resistor element. The temperature coefficient of resistance of the material of the resistor element is usually less than $\pm 5 \cdot 10^{-5}$ 1/K, while the temperature coefficient of resistance of the material of the connection elements is approximately $\pm 4 \cdot 10^{-3}$ 1/K. The connection elements of the resistor arrangement may in particular consist of copper, a preferably low-alloy copper alloy, of aluminum or a preferably low-alloy aluminum alloy, or comprise at least one of these materials. The resistor element may be made of a copper alloy that is usually used as a resistor alloy.

The connection elements may be terminal connection elements of the resistor arrangement. However, it is also possible for at least one connection element to be arranged between two resistor elements in relation to a possible current path. The resistor arrangement may be formed in a planar arrangement. In this case, the connection elements and the at least one resistor element are formed as plate-shaped or strip-shaped elements and arranged next to one another, preferably in a row, in one plane. The thickness of the resistor element or of the resistor elements may in this case be arbitrary. However, it is usually not greater than the thickness of the connection elements.

A contact element is understood to mean a material projection that rises above the otherwise non-deformed surface of a connection element or of the resistor element. The contact element is molded by displacing material of a connection element or material of the resistor element substantially in the direction perpendicular to the surface of the connection element or of the resistor element. The direction in which the material is displaced defines an axial direction parallel to the longitudinal axis of the contact element, and a radial direction perpendicular thereto. The contact element is molded such that it has an end face remote from the resistor arrangement and a cavity that is open on the end face, remote from the resistor arrangement, of the contact element. The contact element is thus at least partially hollow, and the cavity extends, starting from the end face of the contact element, into the contact element in the axial direction. The cavity is delimited in the radial direction by an encircling closed wall made of displaced material of a connection element or of the resistor element. In this region, the contact element thus has the shape of a sleeve that is open on at least one side. The cavity is preferably closed on the diametrically opposite side, such that the contact element has a shape similar to a cup in this region. The height of the contact element is at least 0.5 mm, preferably at least 1 mm.

The external shape of the contact element may be arbitrary, preferably circular, rectangular, square or hexagonal. The contact element preferably has a circular cross section in the region of the cavity. The shape and/or size of the cross section of the contact element may be constant or change in a continuous or non-continuous manner along the longitudinal axis of the contact element. By way of example, the contact element may have a slightly conical contour, that is to say a contour with slightly inclined delimiting surfaces with respect to the surface of the connection element or of the resistor element. The contact element may furthermore be molded such that it has a ledge. A ledge is understood to mean a non-continuous, that is to say sudden change in the cross-sectional shape and/or the cross-sectional size of the contact element. The ledge may serve as a support for a circuit board.

The contact element may, preferably together with a further contact element, be used as a voltage tap for measuring the voltage dropped across the resistor element. When the contact element is molded from the material of the resistor element, it may be used as a voltage tap for measuring the voltage dropped across part of the resistor element. As an alternative, the contact element may also serve to ground the resistor arrangement. One or more such contact elements are preferably molded in all of the connection elements of the resistor arrangement. In this case, the contact elements that serve for the voltage measurement are positioned as close as possible to the resistor element across which the voltage drop is intended to be ascertained.

In the context of the present invention, a circuit board is understood to mean a flat, plate-shaped or strip-shaped component that is suitable for carrying electrical signals in an electrically conductive material. A flat component is plate-shaped or strip-shaped when two opposing services of the component are plane-parallel with one another. The spacing between these two surfaces defines the thickness of the component. A circuit board may for example be a metal strip or a board made from a non-conductive material to whose surface conductor tracks are applied. Such boards are also known by the term "printed circuit board". The circuit board has at least one through-bore having an inner surface on which electrically conductive material is present. This also includes the case in which the circuit board is a metal strip or a metal plate, such that electrically conductive material is inherently present on the inner surface of the through-bore.

If the circuit board is a board made of non-conductive material to whose surface conductor tracks are applied, the electrically conductive material on the inner surface of the through-bore may be connected to a conductor track that is preferably arranged on that side of the circuit board remote from the resistor arrangement. Electrical components may furthermore be arranged on such a circuit board and serve to measure and evaluate electrical signals. The term through-bore is used to denote a recess in the circuit board that extends through the entire thickness of the circuit board. The through-bore may have a cylindrical shape. As an alternative, a conical shape is also possible.

The circuit board is positioned on the resistor arrangement in such a way that the at least one contact element at least projects into the through-bore. The circuit board is in this case positioned substantially plane-parallel to the resistor arrangement, such that the circuit board has an upper side remote from the resistor arrangement and a lower side facing the resistor arrangement. There may be a spacing between the circuit board and the resistor arrangement. However, it is also possible for the circuit board to sit directly on the resistor arrangement. The contact element should project into the through-bore of the circuit board over at least up to half the thickness of the circuit board, preferably over at least up to 70% of the thickness of the circuit board.

The contact element is then expanded in the radial direction using a suitable expansion element. For this purpose, the expansion element is inserted into the cavity of the contact element in the axial direction, starting from the upper side of the circuit board. The expansion element is designed such that it is able to expand the contact element in the radial direction in the region of the cavity. For this purpose, the material of the contact element that delimits the cavity in the radial direction is displaced outwardly in the radial direction to the extent that it comes into contact with the inner surface of the through-bore of the circuit board. This establishes an electrically conductive connection between the contact element and the electrically conductive material on the inner surface of the through-bore. The enlargement of the external dimension of the contact element brought about by the expansion is preferably between 2% and 15% of its external dimension prior to the expansion. The expansion furthermore reduces the wall thickness of the contact element. A reduction by at least 20% of the original wall thickness is expedient. In one embodiment, the expansion element may be a suitable tool that is removed from the cavity of the contact element following the expansion.

The advantage of the described method is that no additional components and/or materials are required to establish the connection between resistor arrangement and circuit board. Because the contact element is molded directly from the material of a connection element or of the resistor element, it is not necessary to mount the contact element separately on the resistor arrangement or on the circuit board. The working steps required for this and the required materials, such as for example solder, are dispensed with. Multiple contact elements may be molded at the same time. The monolithic connection between contact element and connection element or between contact element and resistor element avoids unwanted contact voltages that may distort a measurement.

One particularly advantageous aspect of the proposed method is the radial expansion of the contact element by a suitable expansion element. Because the expansion element is inserted into the cavity of the contact element, the connection between contact element and circuit board takes place substantially in the region of the through-bore. It is thus not necessary for the contact element to project above the circuit board, that is to say to have a protrusion above the upper side of the circuit board. To mold the contact element, the material of the connection element or of the resistor element thus only has to be deformed to a small extent. The required forces are low. This is advantageous in terms of tool service life and process speed. The proposed method may be applied to particular advantage when one or more contact elements are intended to be molded from the resistor element. The material of the resistor element is usually harder to deform than the material of the connection elements. The less it has to be deformed, the easier the process.

The expansion element may also be a body that remains permanently in the cavity of the contact element. Such a body may for example be a plug or a rivet. Such a body establishes particularly reliable and permanent contact between the contact element and the inner surface of the through-bore of the circuit board.

If the resistor arrangement is produced by cutting it to length from a longitudinally seam-welded, strip-shaped composite material, then the contact elements may preferably be molded at the same time as the cutting to length of the composite material. Steps a) and b) of the method thus take place at the same time in this case. A separate additional working step for molding the contact elements is thus not necessary. The method is thus quicker and less expensive than if the contact elements were to be molded only after the composite material has been cut to length. This furthermore achieves high positional accuracy of the contact elements.

In the context of one embodiment of the invention, the expansion element may be designed such that the contact element is expanded by the insertion of the expansion element. The contact element is thus already expanded in the radial direction during the insertion of the expansion element into the cavity. The expansion element at least partially has a conical external contour for this purpose. This external contour leads to a radial displacement of the material of the contact element when the expansion element is inserted into the cavity. This enables short machining times.

In the context of one alternative embodiment of the invention, the expansion element may be designed such that the contact element is expanded following the insertion of the expansion element. The contact element is thus expanded in the radial direction only following the insertion of the expansion element into the cavity. The expansion element has a section whose external diameter is smaller than the internal diameter of the cavity for this purpose. This section of the expansion element is then inserted into the cavity without any significant resistance, and thus also without unwanted deformation of the contact element. The radial expansion of the contact element then takes place using a suitable mechanism following the insertion of the expansion element. If the expansion element is a tool, this radial expansion may be achieved mechanically, for example by spreading the tool or by eccentrically rotating the tool, or the radial expansion may be achieved using electromagnetic forces.

In the context of one preferred embodiment of the invention, the expansion in method step e) may also simultaneously establish a frictional connection between the inner surface of the through-bore of the circuit board and the contact element. For this purpose, the contact element is expanded to such a degree that the material is pressed onto the inner surface of the through-bore of the circuit board to so great an extent that a press fit is formed. The wall thickness of the contact element is in this case preferably reduced by at least 40%. By virtue of the press fit being formed, it is possible to save on other means for mechanically fastening the circuit board to the resistor arrangement.

In the context of one special refinement of this embodiment of the invention, the expansion in method step e) may also simultaneously establish a form-fitting connection between the inner surface of the through-bore of the circuit board and the contact element. By way of example, the through-bore of the circuit board may have a conical shape and be designed such that the internal diameter increases from the lower side of the circuit board towards its upper side. When using an expansion element having an appropriate conical external contour, the expansion of the contact element leads to a form-fitting connection. Such a connection constitutes a particularly secure type of connection.

In the context of one preferred embodiment of the invention, the contact element may have a height that is selected such that, after the circuit board has been positioned, the end face, remote from the resistor arrangement, of the contact element is located within the through-bore of the circuit board or terminates flush with the upper side of the circuit board. The height in this case denotes the extent of the contact element in the axial direction, measured from the non-deformed surface of the connection element or of the resistor element. The height is thus dimensioned such that the penetration depth of the contact element into the through-bore of the circuit board is at most equal to the thickness of the circuit board. It other words, in this embodiment, the contact element has no protrusion above the upper side of the circuit board. A contact element of such small height is able to be molded particularly expediently. In the context of one special refinement of this embodiment of the invention, the penetration depth of the contact element into the through-bore of the circuit board may be 80 to 100% of the thickness of the circuit board. This constitutes an optimum between the required effort when molding the contact element and the quality of the contact between contact element and circuit board.

In the context of a further embodiment of the invention, the contact element may be molded in method step b) through an embossing step or through extrusion. Embossing and extrusion are particularly suitable for molding contact elements that are monolithically connected to the material of the connection elements or of the resistor element and that extend substantially perpendicular to the surface of the connection elements or of the resistor element. The material is in this case molded using a die and a suitable negative mold.

In the context of one special refinement of this embodiment of the invention, to shape the contact element, a negative mold having at least one recess corresponding to the external contour of the contact element and at least one internal tool positioned in the recess may be used to form the cavity, wherein, during method step b), the internal tool is moved in the direction of the longitudinal axis of the contact element relative to the recess. This has proven to be particularly expedient process control in terms of reshaping, meaning that it is possible to produce contact elements with a large height.

In the context of a further special refinement of the invention, the expansion of the contact element in method step e) may be assisted by heating the material of the contact element using ultrasound or using a laser. Due to the deformation in method step b), the material of the contact element is solidified and hard. This is detrimental to the subsequent deformation in step e). The introduction of heat using a laser or using ultrasound makes it possible to heat the material of the contact element to such an extent that it at least partially desolidifies, that is to say becomes softer. The deformation in step e) is then more easily possible.

With regard to further technical features and advantages of the method according to the invention, reference is hereby made explicitly to the explanations below in connection with a device for measuring current strengths and to the figures and the description of the figures.

A further aspect of the invention relates to a device for measuring current strengths. This is also understood to mean measuring the strength of an electric current that possibly changes over time. The device comprises a resistor arrangement and a circuit board mechanically and electrically connected to the resistor arrangement. The resistor arrangement comprises at least two connection elements, which define a current direction, and at least one resistor element arranged between the connection elements in relation to the current direction, wherein the at least one resistor element, on the one hand, and the connection elements, on the other hand, consist of different electrically conductive materials. The circuit board has at least one through-bore having an inner surface on which electrically conductive material is present. The resistor arrangement has at least one contact element having a longitudinal axis, which contact element is monolithically connected to one of the connection elements and is machined from the material of the connection element, or is monolithically connected to the resistor element and is machined from the material of the resistor element. The resistor arrangement is electrically conductively and mechanically connected to the circuit board by way of this contact element, by virtue of the contact element at least projecting into the through-bore of the circuit board and being frictionally connected to the electrically conductive material on the inner surface of the through-bore. For this purpose, the contact element has an end face remote from the resistor arrangement and a cavity that is open on the end face, remote from the resistor arrangement, of the contact element. The contact element has a conical contour at the transition from its end face to the cavity.

With regard to the terms used to describe the device, reference is hereby made explicitly to the above explanations of the terms in connection with the description of the method for producing a device for measuring current strengths.

The particular advantage of the described device is that unwanted contact voltages that may distort a measurement are avoided as a result of the monolithic connection between contact element and connection element or resistor element. The device may furthermore be produced inexpensively and with high precision, since the contact element is molded directly from the material of the connection element or of the resistor element. One particularly advantageous aspect of the described device is the frictional connection between the circuit board and the resistor arrangement. This connection is established by the contact element, which is brought into electrical and mechanical contact with the inner surface of the through-bore of the circuit board through an expansion process. To perform this expansion process, the contact element has an end face remote from the resistor arrangement and a cavity that is open on the end face, remote from the resistor arrangement, of the contact element. The contact element has a conical contour at the transition from its end face to the cavity. This conical contour is the result of the expansion process, and it may serve for the easier insertion of an expansion element into the cavity of the contact element.

In the context of one embodiment of the invention, the contact element may have a height that is selected such that the end face, remote from the resistor arrangement, of the contact element is located within the through-bore of the circuit board or terminates flush with the upper side of the circuit board. The height in this case denotes the extent of the contact element in the direction of its longitudinal axis, measured from the non-deformed surface of the connection element or of the resistor element. The height is thus dimensioned such that the penetration depth of the contact element into the through-bore of the circuit board is at most equal to the thickness of the circuit board. It other words, the contact element has no protrusion above the upper side of the circuit board. A contact element with this small height is able to be molded particularly expediently. In the context of one special refinement of this embodiment of the invention, the penetration depth of the contact element into the through-bore of the circuit board may be 80 to 100% of the thickness of the circuit board. This constitutes an optimum between the required effort when molding the contact element and the quality of the contact between contact element and circuit board.

In the context of one alternative embodiment of the invention, the contact element, on that side of the circuit board remote from the resistor arrangement, may have a protrusion above the circuit board and be laterally broadened, preferably conically expanded, in the region of this protrusion in order to fasten the circuit board. As a result of the lateral broadening, in particular as a result of the conical expansion of the contact element in the region of this protrusion above the circuit board, the circuit board is fastened in a form-fitting manner at least in one direction in the axial direction of the contact element, that is to say in the direction towards the connection element of the resistor arrangement. The lateral broadening may take place externally through conical expansion, including through other deformations of the contact element. Examples of these are crimping, beading, partial bending and expansion using a ball-shaped, cylindrical or spherical tool.

In the context of one particular refinement of this alternative embodiment of the invention, the contact element may have a section having a conical external contour between the connection element and the circuit board. The conical section is in this case selected such that the cross-sectional surface area of the contact element increases towards the connection element. The section having the conical contour directly adjoins the circuit board. As a result of the conical external contour, the cross-sectional surface area of the contact element increases continuously and at least to the extent that it is greater than the cross-sectional surface area of the through-bore of the circuit board. Together with the conical expansion of the contact element in the region of its protrusion, it is thus possible to achieve form-fitting and frictional fastening of the circuit board both in the direction of the axis of the contact element and perpendicular thereto. The circuit board is wedged double-conically by the contact element. This refinement of the invention is particularly resistant to mechanical loads, such as for example vibrations.

In the context of a further advantageous embodiment of the device, the at least one contact element may have a ledge on which the circuit board sits in such a manner that the circuit board is spaced from the connection element and thus from the resistor arrangement. The spacing between the circuit board and the resistor arrangement achieves improved thermal decoupling of the circuit board from the resistor arrangement. The heat that arises when current flows through the resistor element is in this case not able to be transferred directly from the resistor element or from a connection element to the circuit board, but rather the heat has to flow through the contact element. The contact element constitutes a large thermal resistance due to its relatively small cross section. The flow of heat from the resistor arrangement to the circuit board is therefore reduced, and the circuit board remains at a lower temperature level than if the circuit board were to sit directly on a connection element. This embodiment is particularly advantageous when the thickness of the resistor element is not smaller than the respective thickness of the connection elements.

Furthermore, in the context of one particularly advantageous embodiment of the device, provision may be made for a first contact element to have a conical section between the connection element and the circuit board, while a second contact element has a ledge between the connection element and the circuit board and on which the circuit board sits. Both contact elements may in this case in particular have a respective protrusion above the circuit board on that side of the circuit board remote from the resistor arrangement and be laterally broadened in the region of the protrusion. The particular advantage of such a combination of contact elements having a different shape and function is that, in the case of the superimposed load consisting of vibration and temperature change, the first contact element fastens the circuit board in the lateral direction, while the second contact element allows the circuit board to be fastened in a direction perpendicular to the circuit board, without in the process bringing about an additional restriction to freedom of movement in the lateral direction. Stresses that may arise due to differing expansion of the circuit board and the resistor arrangement in the event of a temperature change are thus reduced. The device is thus particularly robust. In one advantageous refinement of the invention, the surface of the at least one contact element may have a metal coating, in particular a coating containing tin, silver or nickel. Such a coating prevents corrosion and may thus ensure that the electrical contact between the contact element and the electrically conductive material on the inner surface of the through-bore is of high quality over the entire service life of the device. The coating may in this case have been applied before the molding of the contact element in step b) or the contact element may have been coated in a separate step between method steps b) and c).

With regard to further technical features and advantages of the device according to the invention, reference is hereby made explicitly to the explanations in connection with the above-described method according to the invention and to the figures and the description of the figures.

BRIEF DESCRIPTION OF THE DRAWINGS

Exemplary embodiments of the invention are explained in more detail with reference to the schematic drawings, in which.

Parts that correspond to one another are provided with the same reference signs in all of the figures.

DETAILED DESCRIPTION

Figure 1:
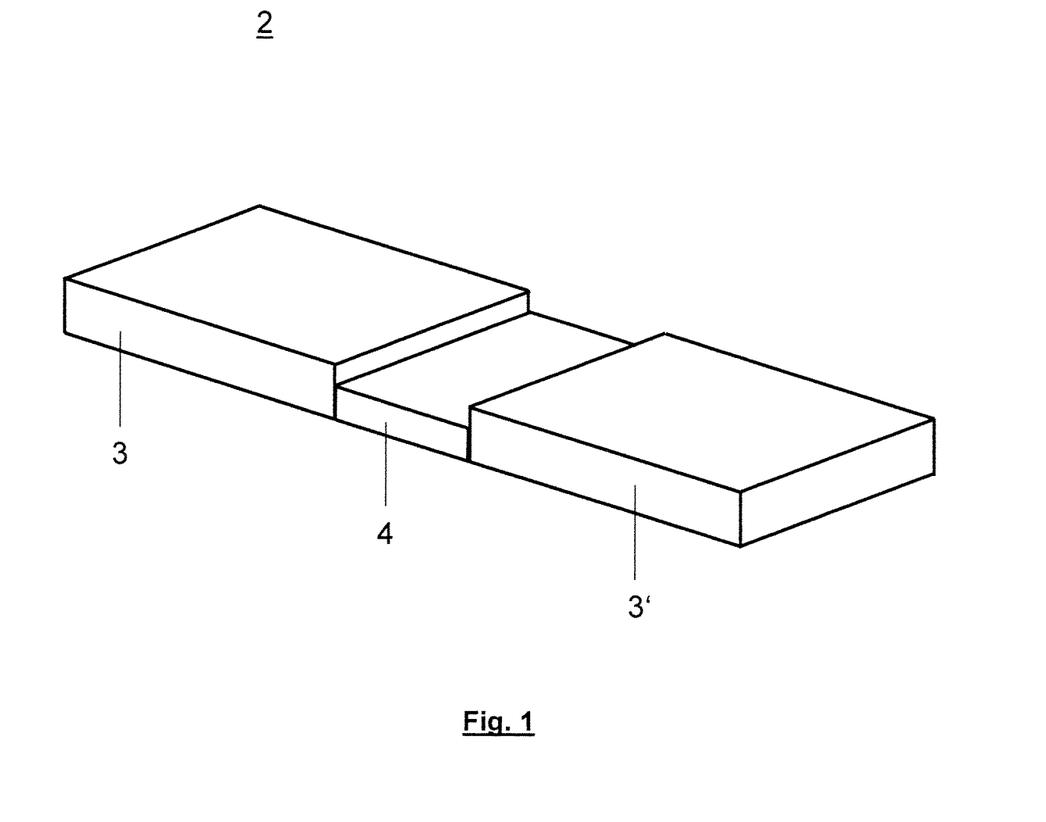
FIG. 1 shows an oblique view of a resistor arrangement.

FIG. 1 shows an oblique view of a resistor arrangement 2 not yet having a contact element. The resistor arrangement 2 has two terminal connection elements 3, 3' and a resistor element 4 that is positioned between the two connection elements 3, 3'. The connection elements 3, 3' and the resistor element 4 are each plate-shaped. The thickness of the resistor element 4 is slightly smaller than the respective thickness of the two connection elements 3, 3'. The resistor arrangement 2 may be connected to a circuit at the two connection elements 3, 3'. For this purpose, the two connection elements 3, 3' may have connection devices, not illustrated, for example bores. These connection devices are each installed in the region of the connection elements 3, 3' that is remote from the resistor element 4. The resistor element 4 is located between the connection elements 3, 3' in relation to the direction of the current flow. When a current flows, a voltage drops across the resistor element 4, on the basis of which voltage the strength of the current flowing through the resistor arrangement 2 is able to be ascertained.

Figure 2:
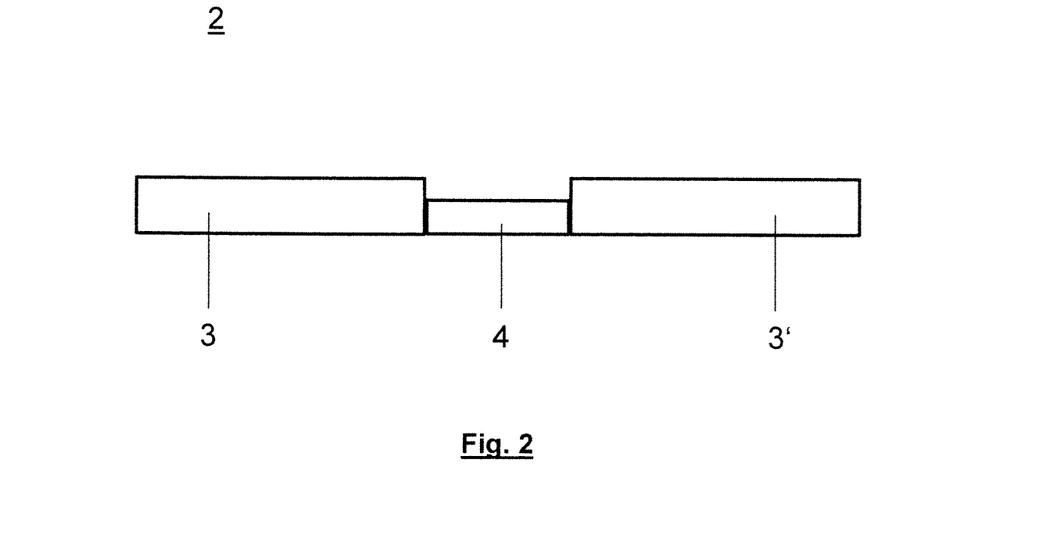
FIG. 2 shows a side view of a resistor arrangement.
Figure 3:
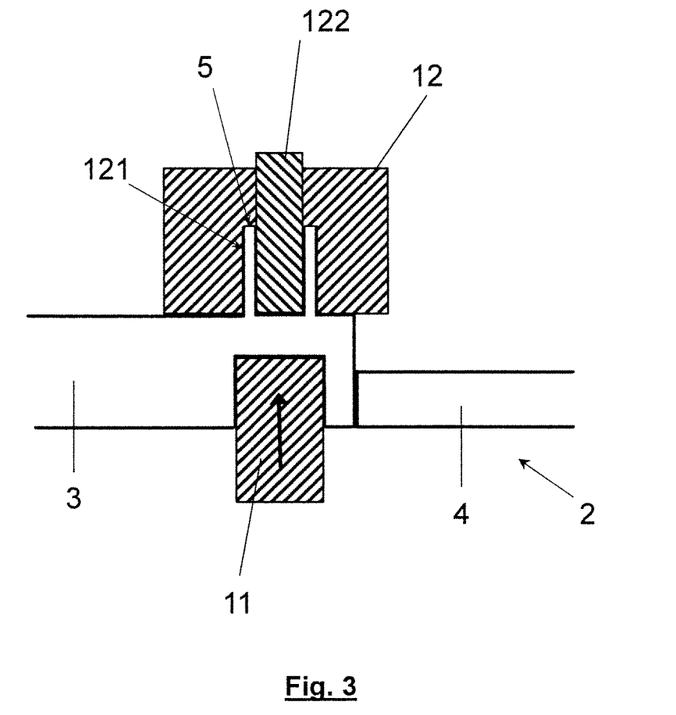
FIG. 3 shows a sectional view of an extract of a resistor arrangement at the end of method step b)

FIG. 2 shows a side view of the resistor arrangement 2 according to FIG. 1. A resistor arrangement 2 as illustrated in FIGS. 1 and 2 may, as is known, be produced by longitudinally seam-welding three strips to form a composite material and then cutting the welded composite material to length. FIG. 3 shows a sectional view of an enlarged extract of the resistor arrangement 2 according to FIGS. 1 and 2 at the end of method step b). A negative mold 12 having a recess 121 and an internal tool 122 arranged in the recess 121 have been positioned on the upper side of the connection element 3. A die 11 has penetrated into the material of the connection element 3 on the lower side of the connection element 3, this being symbolized by the arrow pointing upwards. The die 11 is positioned such that it lies opposite the recess 121 of the negative mold 12. The penetration of the die 11 has deformed material of the connection element 3 substantially perpendicular to the surface of the connection element 3 and displaced it into the empty space of the negative mold 12 defined by the recess 121 and the internal tool 122. This has formed a material projection that forms the contact element 5. The internal tool 122 has the effect that the contact element 5 has a cavity that is open on one side after the internal tool 122 is removed.

Figure 4:
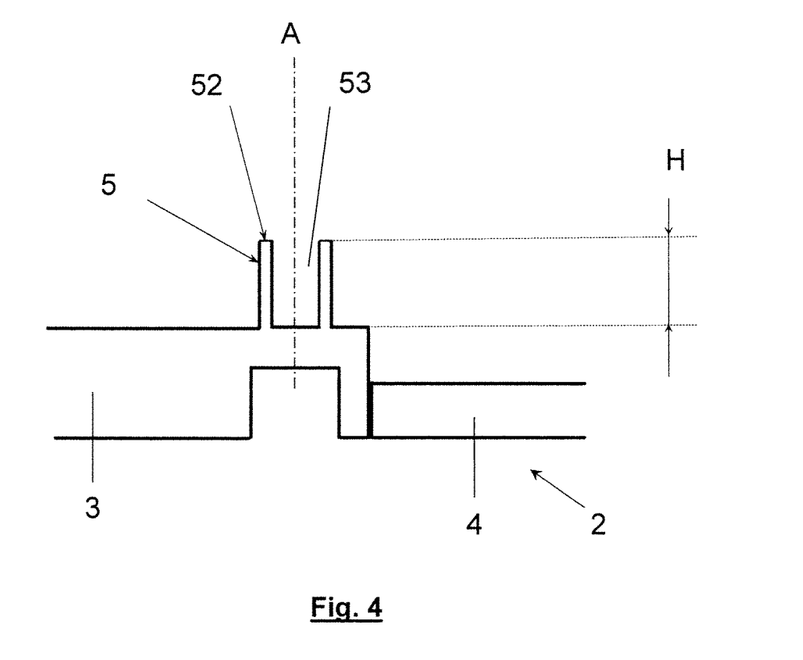
FIG. 4 shows a sectional view of an extract of a resistor arrangement with a molded contact element.

FIG. 4 shows a sectional view of an enlarged extract of the resistor arrangement 2 having a molded contact element 5 after method step b). The die 11 and the negative mold 12 have been removed. To facilitate the removal of the die 11 and the negative mold 12, the die 11, the recess 121 and the internal tool 122 in the negative mold 12 may each have a beveled demolding contour. The molded contact elements 5 may accordingly likewise have a beveled contour. The angle formed by the demolding bevels with the normal to the surface of the connection elements 3 is typically approximately 2°. The bevels are not illustrated explicitly in the figures due to this small deviation from the normal.

The contact element 5 has a longitudinal axis A that is oriented perpendicular to the surface of the connection element 3. The contact element 5 furthermore has an end face 52 that is remote from the connection element 3 and thus from the resistor arrangement 2. Starting from this end face 52, a cavity 53 extends along the longitudinal axis A of the contact element 5. In the illustrated case, this cavity 53 extends approximately to the non-deformed surface of the connection element 3. However, it may be advantageous, for manufacturing reasons, to mold the contact element 5 such that the cavity 53 extends less into the contact element 5 or, as an alternative, that the cavity 53 extends as far as into the material of the connection element 3. As a result of the cavity 53, the contact element 5 has the shape of a sleeve that is closed on one side and open on the other side. The height of the contact element 5 is denoted by the symbol H. The height H is measured starting from the non-deformed surface of the connection element 3 to the end face 52 of the contact element 5.

The contact element 5 is provided in order to tap off the voltage dropped across the resistor element 4. In order to minimize distortions of the measured value, the contact element 5 has been molded from the connection element 3 such that it is positioned close to the connection point between the connection element 3 and the resistor element 4.

Figure 5:
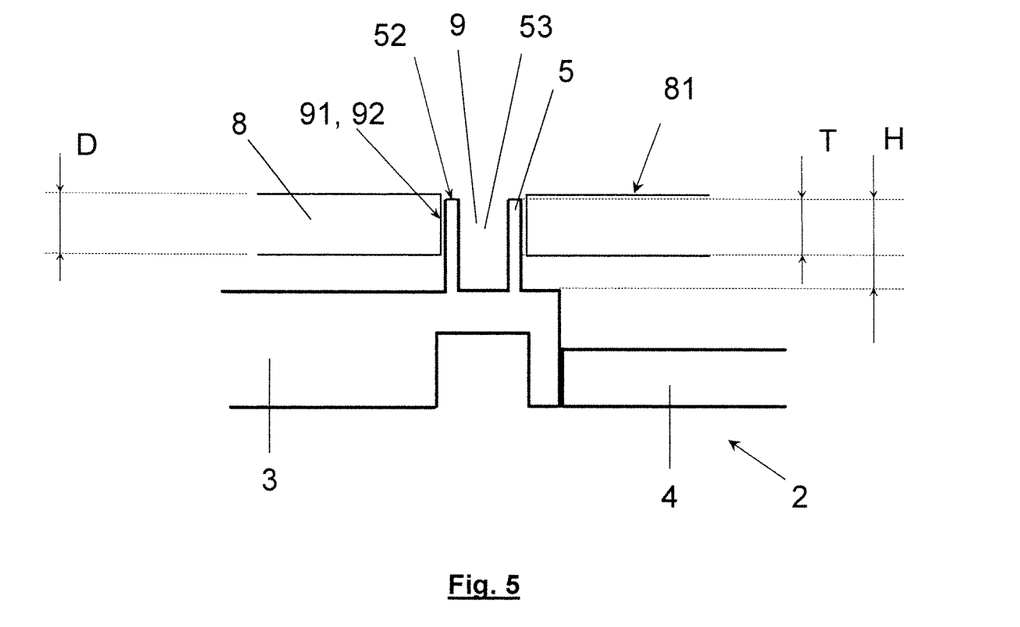
FIG. 5 shows a sectional view of an extract of a resistor arrangement with a circuit board positioned thereon.

FIG. 5 shows a sectional view of the enlarged extract of the resistor arrangement 2 according to FIG. 4 additionally with a circuit board 8 positioned on the resistor arrangement 2 and having the thickness D. FIG. 5 thus represents the resistor arrangement 2 and the circuit board 8 following method step d). The circuit board 8 has a through-bore 9. Electrically conductive material 92 is present on the inner surface 91 of the through-bore 9 of the circuit board 8, and is not illustrated in more detail for the sake of clarity. The circuit board 8 has been positioned such that the contact element 5 projects into the through-bore 9 to a penetration depth T. In the illustrated case, the penetration depth T is slightly less than the thickness D of the circuit board 8, such that the end face 52 of the contact element 5 does not terminate flush with the upper side 81 of the circuit board 8, but rather is still located slightly within the through-bore 9. The penetration depth T is approximately 90% of the thickness D of the circuit board 8. The thin width of the through-bore 9 is slightly greater than the external dimension of the contact element 5. In the illustrated exemplary embodiment, the circuit board 8 does not sit directly on the connection element 3, this possibly being achieved for example using spacers, not illustrated. A large spacing between the circuit board 8 and the resistor element 4 is advantageous because heat that arises in the resistor element is thereby able to be dissipated quickly. Electronic components that are possibly present on the circuit board 8 are not illustrated for the sake of clarity.

Figure 6:
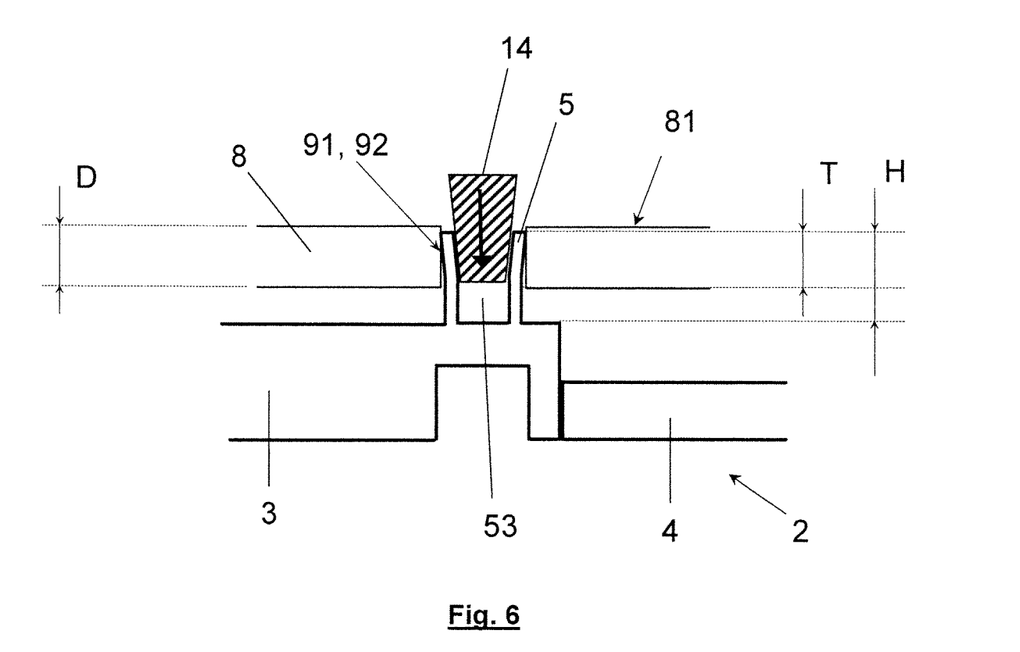
FIG. 6 shows a sectional view of an extract of a resistor arrangement during method step e)

FIG. 6 shows a sectional view of the enlarged extract of the resistor arrangement 2 during method step e). A conical expansion element 14 is inserted into the cavity 53 of the contact element 5 in the direction of the arrow. The external dimension of the expansion element 14 is selected such that the conical shape of the expansion element 14 displaces the material of the contact element 5 outwardly in the radial direction, that is to say towards the inner surface 91 of the through-bore 9. The contact element 5 thereby comes into contact with the electrically conductive material 92 on the inner surface 91 of the through-bore 9, forming an electrically conductive connection. The expansion element 14 illustrated in FIG. 6 may be a body that remains in the cavity 53 of the contact element 5, or it may be the working region of a tool that is removed from the cavity 53 of the contact element 5 following the expansion. If the expansion element is a body, such body may be in the form of a plug, indenter, plunger or a rivet and may have a conical shape as shown in FIG. 6. Alternatively, the plug, indenter, plunger or rivet may have a cylindrical shape with a chamfered insertion end. Alternatively, the expansion element may be a tool, and such tool may be a swage, die, an expanding mandrel or a hand-held tube expander. A swage or die with a conical shape may be used to expand the contact element 5 during insertion of the conical swage or die into the cavity 53. If the tool is an expanding mandrel or a hand-held tube expander, expansion of the contact element 5 occurs after the mandrel or tube expander is inserted into the cavity 53.

Figure 7:
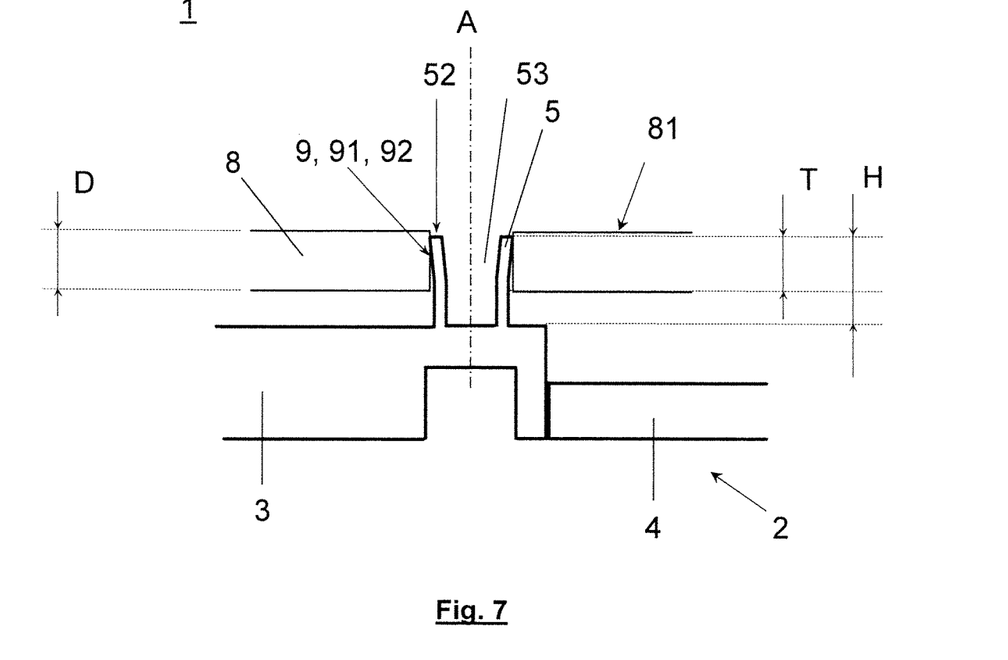
FIG. 7 shows a sectional view of an extract of a resistor arrangement with a circuit board fastened thereto.

FIG. 7 shows a sectional view of the enlarged extract of the resistor arrangement 2 according to FIG. 6 following removal of the tool used for the expansion. FIG. 7 at the same time represents the sectional view of part of a device 1 for measuring current strengths using the resistor arrangement 2.

Figure 8:
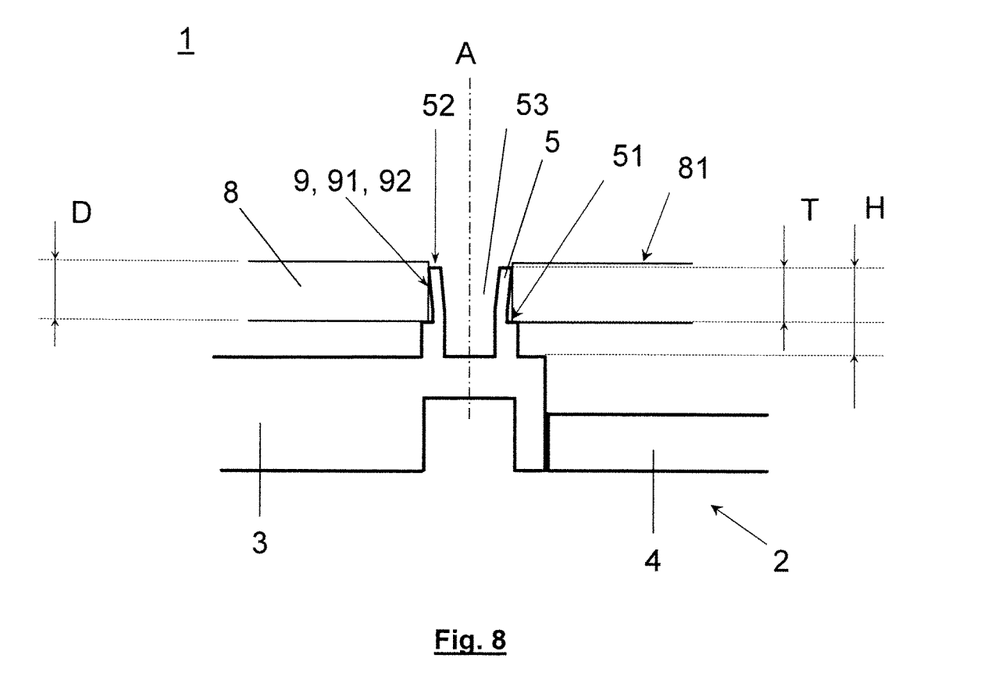
FIG. 8 shows a sectional view of an extract of a resistor arrangement with a circuit board fastened thereto and with a contact element having a ledge.

FIG. 8 shows, as a further exemplary embodiment, the sectional view of part of a device 1 for measuring current strengths, having a resistor arrangement 2 and a circuit board 8 positioned on the resistor arrangement 2. The contact element 5 has an encircling ledge 51 on which the circuit board 8 sits. For this purpose, the contact element 5 is designed such that the external dimension of the contact element 5, in the subregion directly adjoining the connection element 3, is larger than the thin width of the through-bore 9 of the circuit board 8. The circuit board 8 thus does not sit either on the connection element 3 or on the resistor element 4, even without additional spacers. The height of the ledge 51 was already taken into consideration when molding the contact element 5 from the material of the connection element 3. The circuit board 8 is contacted by the contact element 5 in the same way as in the exemplary embodiment illustrated in FIG. 6 and explained in connection with FIG. 6.

Figure 9:
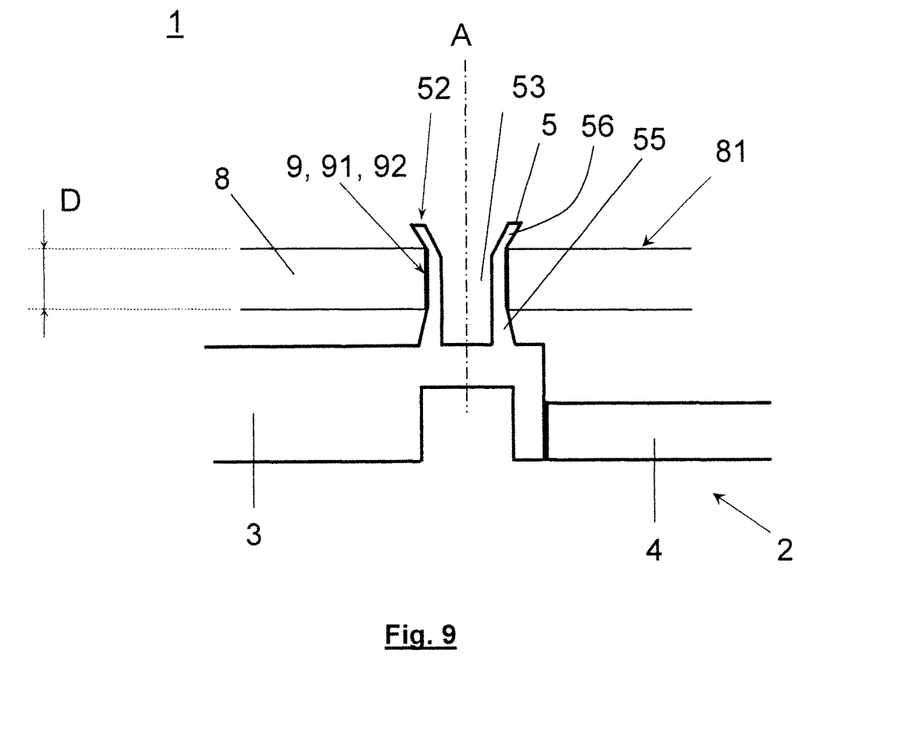
FIG. 9 shows a sectional view of an extract of a resistor arrangement with a circuit board fastened thereto and with a contact element having a conical section.

FIG. 9 shows, as a further exemplary embodiment, the sectional view of part of a device 1 for measuring current strengths, having a resistor arrangement 2 and a circuit board 8 positioned on the resistor arrangement 2. The contact element 5, between the connection element 3 and the circuit board 8, has a section 55 having a conical external contour that directly adjoins the circuit board 8. The contact element 5 furthermore has a protrusion 56 above the circuit board 8. The contact element 5 has been conically expanded in the region of this protrusion 56. The contact element 5 thereby projects, in the lateral direction, above the upper side 81 of the circuit board 8. As a result of the conical expansion of the contact element 5 in the region of its protrusion 56, the circuit board 8 has been moved in the direction towards the connection element 3 and thus pressed onto the conical section 55 of the contact element 5 between the circuit board 8 and the connection element 3. The circuit board 8 is thereby fastened in a frictional manner in the direction of the longitudinal axis A of the contact element.

For the sake of better legibility, the invention has been explained by way of example in FIGS. 1 to 9 on the basis of a resistor arrangement 2 that comprises only one resistor element 4 and two terminal connection elements 3, 3'. It is also possible to apply the method described above to resistor arrangements that have two or more resistor elements and at least one further connection element arranged between two resistor elements in relation to a possible current path. The resistor arrangement may in this case be configured such that the same current flows through at least two resistor elements, thereby allowing a redundant current measurement, or that different currents flow through at least two resistor elements, thereby allowing partial currents to be measured. The method for molding contact elements 5 and for establishing an electrical connection with a circuit board 8, as explained with reference to the above description, with reference to FIGS. 1 to 9 and with reference to the exemplary embodiments, may in these cases also be used to mold one or more contact elements 5 from the material of a connection element arranged between two resistor elements.

The invention claimed is:

1. A method for producing a device for measuring the strength of an electric current using a resistor arrangement, wherein the method comprises the following steps:
   a) providing a resistor arrangement comprising at least two connection elements and at least one resistor element arranged between the at least two connection elements in relation to a direction of the electric current, wherein the at least one resistor element and the at least two connection elements comprise different electrically conductive materials;
   b) molding at least one contact element from the material of at least one of the at least two connection element or from the material of the at least one resistor element, wherein the at least one contact element has a longitudinal axis defining an axial direction and a radial direction perpendicular thereto, and wherein the at least one contact element is molded such that the at least one contact element has an end face remote from the resistor arrangement and a cavity open on the end face,
   c) providing a circuit board having at least one through-bore with an inner surface and electrically conductive material on the inner surface;
   d) positioning the circuit board on the resistor arrangement such that the circuit board has an upper side remote from the resistor arrangement and such that the at least one contact element at least projects into the through-bore; and
   e) expanding the at least one contact element in the radial direction using an expansion element inserted into the cavity of the at least one contact element in the axial direction, to establish an electrically conductive connection between the at least one contact element and the electrically conductive material on the inner surface of the through-bore.

2. The method according to claim 1, wherein the expansion element is configured such that the at least one contact element is expanded by the insertion of the expansion element.

3. The method according to claim 1, wherein the expansion element is configured such that the at least one contact element is expanded following the insertion of the expansion element.

4. The method according to claim 1, wherein the expansion in method step e) establishes a frictional connection between the inner surface of the through-bore of the circuit board and the at least one contact element.

5. The method according to claim 1, wherein the at least one contact element has a height selected such that, after the circuit board has been positioned on the resistor arrangement of the at least one contact element is located within the through-bore of the circuit board or terminates flush with an upper side of the circuit board.

6. The method according to claim 1, wherein the at least one contact element is molded in method step b) through an embossing step or through extrusion.

7. The method according to claim 6, wherein, to shape the at least one contact element, a negative mold having at least one recess corresponding to an external contour of the at least one contact element and at least one internal tool positioned in the at least one recess is used to mold the cavity and, during method step b), the internal tool is moved in a direction of the longitudinal axis of the at least one contact element relative to the at least one recess.

8. The method according to claim 1, wherein the expansion of the at least one contact element in method step e) is assisted by heating the material of the at least one contact element using ultrasound or using a laser.

9. A device for measuring the strength of an electric current, comprising a resistor arrangement and a circuit board mechanically and electrically connected to the resistor arrangement, wherein the resistor arrangement comprises at least two connection elements and at least one resistor element arranged between the at least two connection elements in relation to a direction of the current, wherein the at least one resistor element and the at least two connection elements comprise different electrically conductive materials, and wherein the circuit board has at least one through-bore having an inner surface and electrically conductive material on the inner surface wherein the resistor arrangement has at least one contact element having a longitudinal axis, the at least one contact element is monolithically connected to one of the at least two connection elements and is machined from the material of the one connection element, or is monolithically connected to the resistor element and is machined from the material of the resistor element, to electrically conductively and mechanically connect the resistor arrangement to the circuit board by virtue of the at least one contact element at least projecting into the through-bore of the circuit board and being frictionally connected to the electrically conductive material on the inner surface of the through-bore,
   wherein the at least one contact element has an end face remote from the resistor arrangement and a cavity . . . tis open on the end face of the at least one contact element, and wherein the at least one contact element has a conical contour at a transition from the end face to the cavity.

10. The device according to claim 9, wherein the at least one contact element has a height selected such that the end face of the at least one contact element is located within the through-bore of the circuit board or terminates flush with the upper side of the circuit board.

11. The device according to claim 9, wherein the at least one contact element, on a side of the circuit board remote from the resistor arrangement, has a protrusion above the circuit board and is laterally broadened in a region of the protrusion to fasten the circuit board.

12. The device according to claim 11, wherein the at least one contact element, between the one connection element and the circuit board, has a section having a conical external contour, such that a cross-sectional surface area of the at least one contact element increases towards the one connection element.

13. The device according to claim 9, wherein the at least one contact element has a ledge, the circuit board sitting on the ledge such that the circuit board is spaced from the resistor arrangement.

14. The device according to claim 9, wherein the at least one contact element has a surface with a metal coating.

15. The device according to claim 14, wherein the metal coating comprises tin, silver or nickel.

\* \* \* \* \*

UNITED STATES PATENT AND TRADEMARK OFFICE
CERTIFICATE OF CORRECTION

PATENT NO. : 12,130,307 B2
APPLICATION NO. : 17/852572
DATED : October 29, 2024
INVENTOR(S) : Gerhard Thumm et al.

Page 1 of 1

It is certified that error appears in the above-identified patent and that said Letters Patent is hereby corrected as shown below:

In the Claims

Claim 1, Column 13, Line 37; change "two connection element" to ---two connection elements---

Claim 1, Column 13, Line 44; change "the end face," to ---the end face;---

Claim 5, Column 14, Lines 7-8; change "resistor arrangement of the at least" to ---resistor arrangement, the end face of the at least---

Claim 9, Column 14, Line 37; change "inner surface wherein" to ---inner surface, wherein---

Claim 9, Column 14, Lines 51-52; change "and a cavity . . . tis open" to ---and a cavity open---

Signed and Sealed this
Seventeenth Day of December, 2024

Derrick Brent
*Acting Director of the United States Patent and Trademark Office*